(12) United States Patent
Kakuchi et al.

(10) Patent No.: US 6,614,535 B1
(45) Date of Patent: Sep. 2, 2003

(54) EXPOSURE APPARATUS WITH INTERFEROMETER

(75) Inventors: Osamu Kakuchi, Utsunomiya (JP); Eiichi Murakami, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/533,376

(22) Filed: Mar. 22, 2000

(30) Foreign Application Priority Data

Mar. 24, 1999 (JP) ............................................. 11-079287

(51) Int. Cl.[7] .................................................. G01B 9/02
(52) U.S. Cl. ...................................................... 356/515
(58) Field of Search ................................. 356/511, 512, 356/515, 618

(56) References Cited

U.S. PATENT DOCUMENTS

| 5,381,210 A | 1/1995 | Hagiwara |
| 5,801,815 A | 9/1998 | Takahashi |
| 5,805,273 A | 9/1998 | Unno |
| 5,828,455 A | 10/1998 | Smith et al. |
| 5,898,501 A | * 4/1999 | Suzuki et al. ............... 356/511 |
| 6,278,514 B1 | 8/2001 | Ohsaki |
| 6,281,966 B1 | 8/2001 | Kenmoku |

* cited by examiner

*Primary Examiner*—Samuel A. Turner
*Assistant Examiner*—Patrick Connolly
(74) *Attorney, Agent, or Firm*—Fitzpatrick, Cella, Harper & Scinto

(57) ABSTRACT

A projection exposure apparatus includes an exposure light source, an illumination system for illuminating a pattern, formed on a first object, with light from the exposure light source and passing through the illumination system, a projection optical system for projecting the pattern, as illuminated with the light, onto a second object for exposure of the same with the pattern and an interferometer for use in measurement of an optical characteristic of the projection optical system, wherein the interferometer is operable to perform the measurement by use of light from the exposure light source.

15 Claims, 6 Drawing Sheets

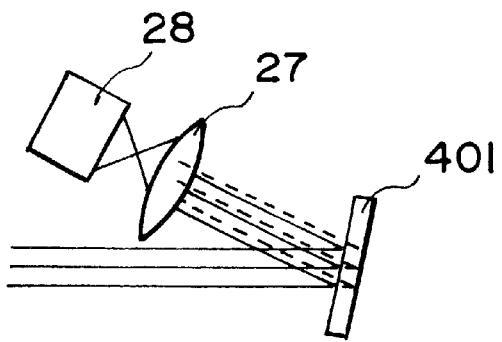
F I G. 4
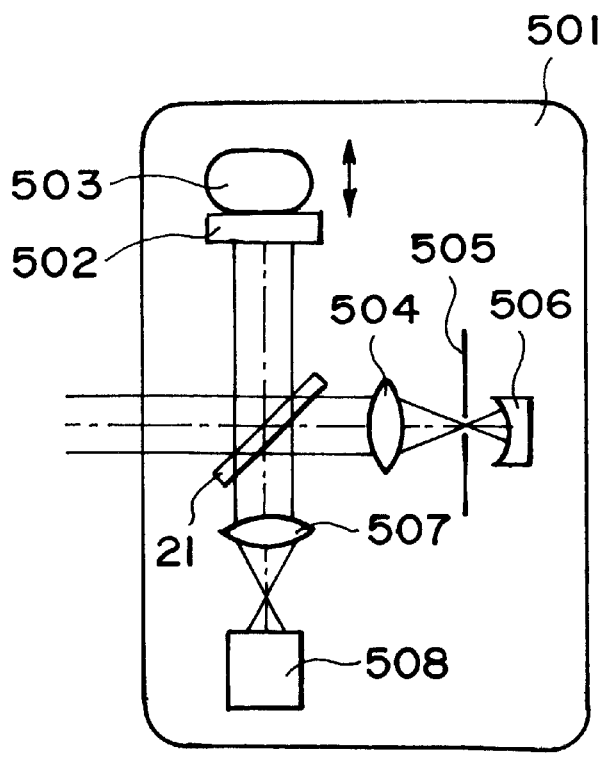
F I G. 5

EXPOSURE APPARATUS WITH INTERFEROMETER

FIELD OF THE INVENTION AND RELATED ART

This invention relates to a projection exposure apparatus and, more particularly, to a projection exposure apparatus suitably usable in a lithographic process, for the production of large-scale integration devices, wherein an electronic circuit pattern formed on the surface of a mask or reticle (hereinafter, "reticle") is printed on a wafer by projection through a projection optical system or by scanning exposure, for the manufacture of various devices such as semiconductor devices (e.g., ICs or LSIs), image pickup devices (e.g., CCDs), display devices (e.g., liquid crystal panels), or magnetic heads, for example.

In a photolithographic process for the production of semiconductor devices or liquid crystal panels, for example, a pattern formed on the surface of a reticle is transferred, by exposure and by use of a projection optical system, onto a photosensitive substrate such as a wafer or a glass plate on which a photoresist is applied.

The density of integrated devices such as ICs or LSIs is increasing more and more, and semiconductor wafer microprocessing techniques have been advanced to meet the same. Projection exposure apparatuses play a major role in such microprocessing techniques, and there are a unit-magnification projection exposure apparatus (mirror projection aligner) wherein a mask and a photosensitive substrate are exposed while being scanned with respect to a unit-magnification mirror optical system having an exposure region of an arcuate shape, and a reduction projection exposure apparatus (stepper) wherein an image of a mask pattern is formed on a photosensitive substrate through a dioptric system and the photosensitive substrate is exposed in accordance with a step-and-repeat method.

Recently, the resolving power of a projection optical system to be incorporated into a projection exposure apparatus has been increased more and more, and thus, very strict requirements have been applied to aberration correction for the projection optical system. For this reason, after a projection optical system is mounted on a major assembly of an exposure apparatus, in many cases, the optical performance of the projection optical system is measured and inspected.

For inspection of the performance of a projection optical system incorporated into a main assembly of an exposure apparatus, particularly, for the inspection of aberrations, a plurality of light blocking patterns (such as line-and-space patterns) are formed on a light transmitting portion of a reticle, and the reticle pattern is then actually printed on a wafer. A resist image thus formed is then observed by use of an electron microscope, for example, to perform the inspection.

The method of inspecting the optical performance of a projection optical system, by observing a resist image printed on a wafer with the use of an electron microscope, involves a complicated procedure such as an exposure process and a development process, to obtain a resist image. As a result, it needs a very long time for the whole inspection.

Further, it requires the use of a high precision measuring system for the inspection of a resist image. Currently, a scanning electron microscope (SEM) is the only inspection apparatus therefor. However, the measurement precision of the SEM is variable with the optical axis alignment precision of electron optical systems or the inside vacuum level thereof, for example. Thus, there is a possibility that a difference is produced in measured values, depending on individual skills of operators or the state of the apparatus, for example.

Additionally, because of inspection of a resist image formed on a wafer, the inspection precision will degrade largely if there is an error in a resist process (e.g., resist coating or development) and, particularly, the inspection reproducibility is lowered significantly in that case. Further, since the inspection printing has to be done with respect to each of the illumination conditions which might be used practically in device printing operations, heavy work is necessary for the inspection.

On the other hand, in accordance with further miniaturization of devices, very strict requirements are applied with respect to maintaining the optical performance of a projection optical system. For example, in some cases, a small change in optical performance of a projection optical system caused during transportation of the same has to be measured at the time of set-up, and re-adjustment has to be done after the set-up to assure the best optical performance.

Also, it is desired to minimize a change in the optical performance of a projection optical system due to a change in illumination condition. To this end, it is desired that the performance of a projection optical system in various conditions, as the same is mounted on a main assembly of an exposure apparatus, can be measured conveniently.

Practically, during an exposure process, a projection optical system is warmed by an illumination system and, as a result, the image performance may be changed thereby. Conventional exposure apparatuses are not equipped with any means for performing image evaluation or measurement of wavefront aberration of a projection optical system, and they have no adjusting means therefor. The only way to meet the same is to interrupt the operation of the apparatus.

SUMMARY OF THE INVENTION

It is accordingly an object of the present invention to provide a projection exposure apparatus having an interferometer, by which an optical performance of a projection optical system can be measured and inspected conveniently and precisely in a short time, upon a main assembly of a projection exposure apparatus and under various illumination conditions.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic view of an interferometer according to a third embodiment of the present invention.

FIG. 5 is a schematic view of an interferometer according to a fourth embodiment of the present invention.

DESCRIPTION OF THE PREFERRED EMBODIMENTS

Figure 1:
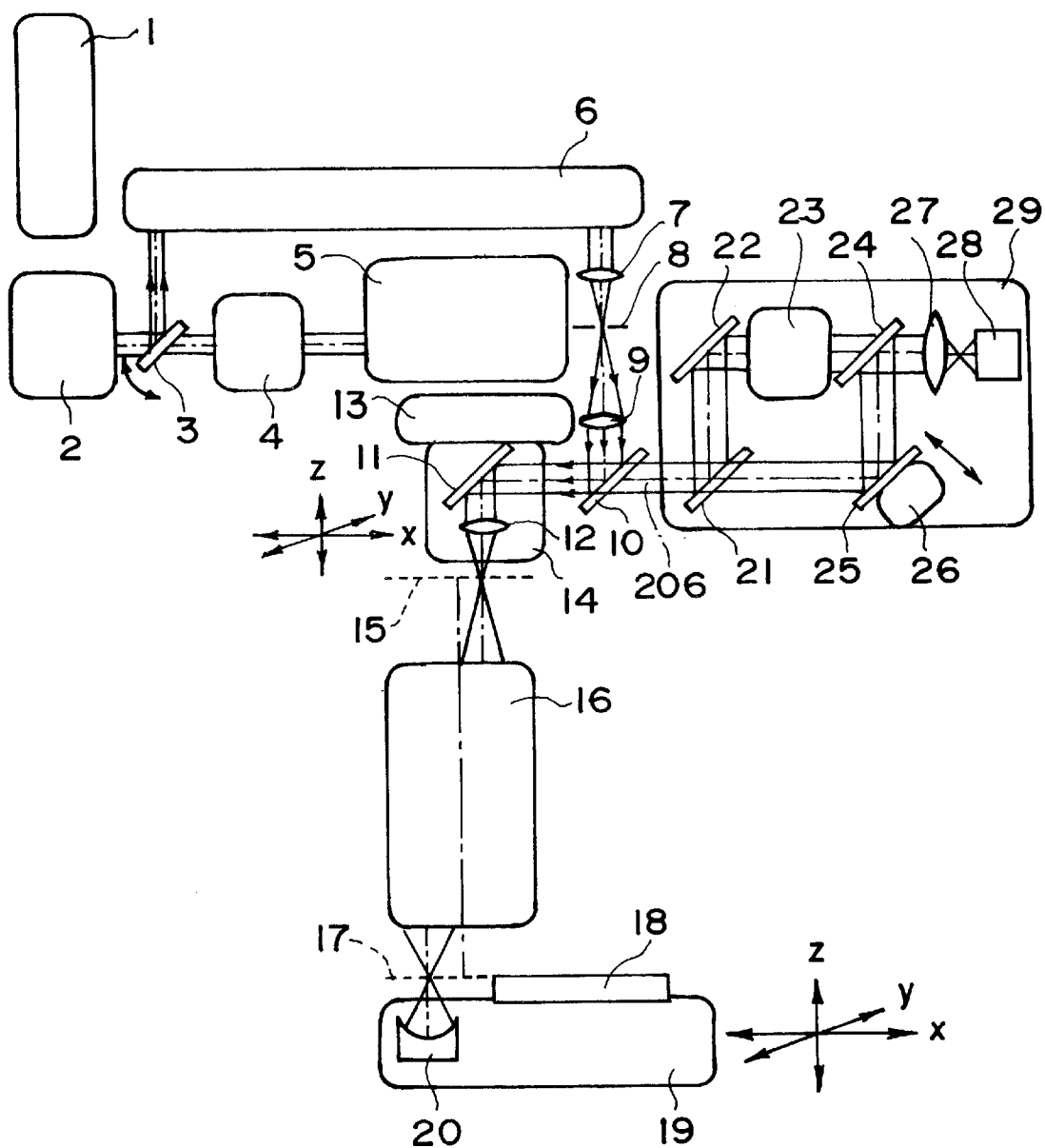
FIG. 1 is a schematic view of a main portion of a projection exposure apparatus according to a first embodiment of the present invention.

FIG. 1 is a schematic view of a main portion of a projection exposure apparatus according to a first embodiment of the present invention, which is equipped with an interferometer of the present invention. In this embodiment, the invention is applied to a stepper (projection exposure apparatus) of an ordinary type or a scan type.

In FIG. 1, light emitted from an exposure light source 1, which comprises an excimer laser (e.g., an ArF excimer laser or a KrF excimer laser), for example, is transformed by a beam shaping optical system 2 into a light beam of a symmetrical shape with respect to an optical axis, and then it is directed to a light path switching mirror 3. The switching mirror 3 is placed out of the light path, during a normal exposure operation. The light emitted from the beam shaping optical system 2 enters an incoherency transforming unit 4 which includes a fly's eye lens, for example, by which the coherency of the light is lowered. After this, the light passes through an illumination optical system 5, and it illuminates the surface of a reticle (first object) 15. The elements denoted at 2, 4 and 5 are components of an illumination system. Denoted at 16 is a projection optical system for projecting a pattern, formed on the reticle 15 surface, onto the surface of a wafer (second object) 17.

The structure of an interferometer in this embodiment will be described below.

The light path switching mirror 3 is disposed on the light path, during a period other than the exposure period. The exposure light from the beam shaping optical system 2 is reflected by the switching mirror 3 to a light guiding optical system 6, by which the light is directed to a portion about an interferometer 29, which is disposed adjacent to the reticle 15 surface. Here, the light guiding optical system 6 comprises a plurality of reflection mirrors. However, it may comprise a light guiding fiber. On that occasion, the fiber may preferably be a polarization plane preserving fiber.

The light emitted from the guiding optical system 6 is collected by a condenser lens 7 to a single point. There is a pinhole 8 disposed adjacent to a focal point of the condenser lens 7. The light passing through the pinhole 8 is transformed by a collimator lens 9 into parallel light. Here, the diameter of the pinhole 8 is set to be approximately equal to an Airy disc as determined by the numerical aperture of the collimator lens 9. As a result of this, the light emitted from the pinhole 8 comprises a substantially idealistic spherical wave. Also, the collimator lens 9 is designed and produced, substantially free from aberration. Therefore, the light from the collimator lens 9 emits as a substantially idealistic spherical plane wave. The parallel light from the collimator lens 9 is reflected by a half mirror 10, and it is directed to a plane mirror 11 mounted on an X-Y-Z stage 13 and a collimator lens 12.

Figure 2:
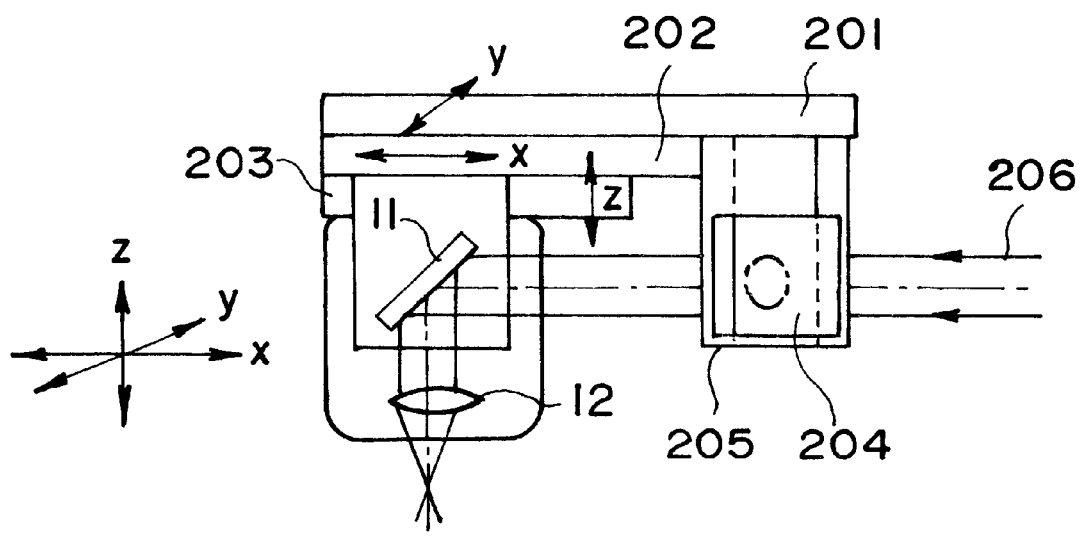
FIG. 2 is a schematic view for explaining details of a light path to the surface of a reticle, in the example of FIG. 1.

Referring to FIG. 2, the path of light to the collimator lens 12 will be described in detail. Light 206 as reflected by the half mirror 10 is deflected to a fixed mirror 204 to the optical axis direction. Then, it is reflected by a mirror 205, mounted on a Y stage 201, toward the X-axis direction. Further, by means of a mirror 11 disposed on an X stage 202, the light is deflected toward the Z-axis direction. Then, by means of the collimator lens 12 disposed on a Z stage 203, it is collected upon the surface of the reticle 15 (FIG. 1). By moving the X-Y-Z stage 13 while the light goes along the path described above, the light reflected by the half mirror 10 can be collected at any desired position on the reticle 15 surface. Here, by moving the X-Y-Z stage 13, the collimator lens 12 can be moved onto and out of the light path. The light as collected upon the reticle 15 surface is re-imaged by the projection lens 16 on the wafer 17 surface.

There is a spherical surface mirror 20 (reflection means) which is mounted on or inside a wafer stage (X-Y-Z stage) 19. Here, the curvature center of the spherical mirror 20 is placed substantially in registration with the wafer 17 surface. The light from the projections lens 16 is reflected by the spherical mirror 20, by which the light goes back substantially along its oncoming path, via the projection lens 16, the collimator lens 12, the mirrors 11, 205 and 204. Then, it reaches again the half mirror 10 of the interferometer and, after passing through the same, it impinges on a half mirror 21.

The spherical mirror 20 may be replaced by a plane mirror, or it may be a wafer surface in substitution therefor. On that occasion, the plane mirror should be placed in registration with the wafer 17 surface. Further, a plane mirror may be moved to the imaging position of the projection lens 16, such that the light may be reflected by vertex reflection.

The interferometer 29 of the first embodiment comprises a radial share type interferometer. Usually, light from an exposure light source incorporated into an exposure apparatus has a short coherent length and, thus, for interference measurement, the optical path lengths of a reference light and measurement light should be registered with each other. For example, it is about a few tens of millimeters in a case wherein the light source 1 comprises an excimer laser, and the coherent length is about a few tens of microns in a case of an i-line stepper, since the spectral width of the light from the light source is adjusted to a few nanometers by use of an interference filter. Thus, the optical path difference between the reference light and the measurement light is adjusted, inside the interferometer 29, to be equal to or less than the coherent length described above. The interferometer may be equipped with a function for performing the adjustment as desired.

The inside structure of the interferometer 29 will be described below. First, the light is divided by a half mirror 21 into transmitted light and reflecting having an intensity ratio of about 1:1. The reflected light is then reflected by a mirror 22 and, thereafter, a central portion of it is expanded by a beam expander 23. Usually, the beam expander 23 may have a magnification of 10× or more, for example. The light having its central portion expanded by the beam expander 23 goes through a half mirror 24 and, as reference light, it is collected by a lens 27 and is incident upon the surface of a CCD camera 28.

On the other hand, the transmitted light from the half mirror 21 is reflected by a mirror 25 and then by the half mirror 24, such that it is collected by the lens 27 and is incident on the surface of the CCD camera 28. Thus, it is superposed on the reference light beam having its central portion expanded, whereby an interference fringe is produced. Here, as regards the interference fringe to be observed, since the central portion of the reference light has been expanded by the beam expander 23, it can be considered as being a substantially idealistic wavefront. Thus, it bears the information related to the sum of wavefront aberrations and shape errors of the lens to be examined (i.e., the projection lens) and of the intermediate optical system (i.e., the collimator lens 12, the spherical mirror 20 and the mirrors, etc.). Therefore, the wavefront aberrations and shape errors, for example, of the intermediate optical system should be measured beforehand by use of a separate interferometer. Alternatively, they may be determined beforehand in accordance with a system error measuring method (i.e., a method in which the spherical mirror 20 is disposed below the condensing lens 12 and the wavefront aberration is measured within respect to three states of 0 degrees, 180 degrees and vertex reflection, such that wavefront aberrations of the spherical mirror 20 and other optical systems may be determined by calculation), and the result may be subtracted from the wavefront aberration as measured through the projection lens 16 as described above.

Accurate measurement of wavefront aberration can be accomplished in accordance with a fringe scan method. Modulation of phase as required in the fringe scan method may be done by moving the mirror 25 by use of a PZT device 26, for example, by an amount of about the wavelength, to change the optical path length of the light to be examined. Alternatively, the mirror for the reference light may be displaced.

As a method for processing the interference fringe, a method called an "electron moire method" may be used. On that occasion, the use of the PZT device 26 is unnecessary. By tilting the mirror 25, for example, a fringe called a "carrier fringe" may be produced.

In this embodiment, in accordance with the wavefront aberration of the projection lens 16 as measured as described above, a predetermined lens or lenses of the projection lens 16 may be moved along an optical axis direction or a direction orthogonal to the optical axis direction, or, alternatively, in a tilt direction, by which spherical aberration, coma or astigmatism, for example, can be corrected.

Figure 3:
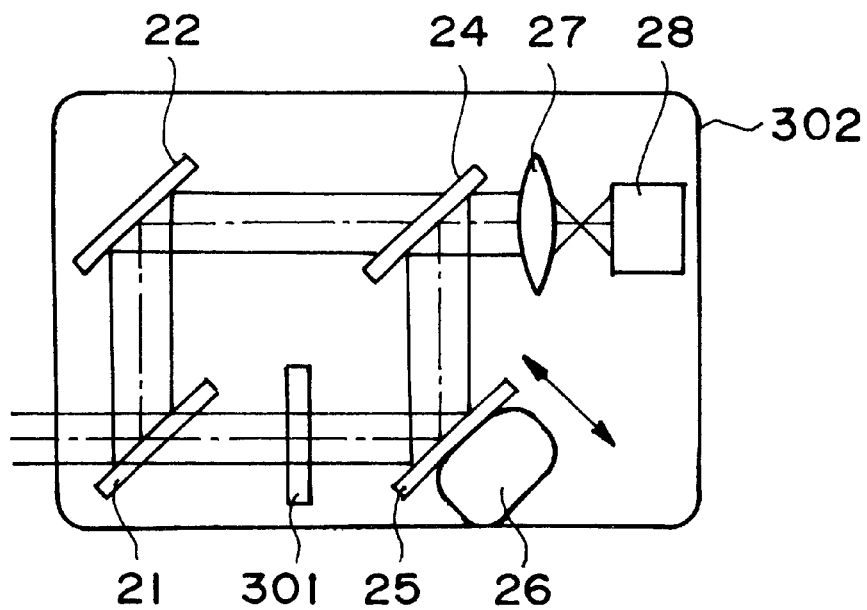
FIG. 3 is a schematic view of an interferometer according to a second embodiment of the present invention.

FIG. 3 is a schematic view of a main portion of an interferometer 302 according to a second embodiment of the present invention.

In this embodiment, the interferometer 29 of the first embodiment is structured into a Mach-Zehnder type lateral share interferometer 302. Only the light transmitted through the half mirror 21 is directed to pass through a parallel flat plate 302 being tilted by a small amount, by which lateral shift of the light is produced. Then, it is reflected by a mirror 25 towards a half mirror 24. On the other hand, the light reflected by the half mirror 21 and without such lateral shift, is reflected by a mirror 22 toward the half mirror 24, such that it interferes with the light having been laterally shifted as described above. An interference fringe produced thereby is observed through a CCD camera 28. The interference fringe being observed corresponds to a differentiated value of the total wavefront aberrations of the projection lens and the other optical systems. Thus, by integrating the same and, thereafter, by subtracting the system error wavefront aberration therefrom, like the first embodiment, the wavefront aberration of only the projection optical system (projection lens) 16 can be determined. Once the optical path length is adjusted and registered either at the transmission side or at the reflection side of the half mirror 21, interference measurement can be done sufficiently even with an excimer laser having a short coherent length or with the i-line having a spectral width of about a few nanometers.

FIG. 4 is a schematic view of a portion of an interferometer according to a third embodiment of the present invention.

Also, in this embodiment, an interferometer is structured into a lateral share type interferometer. As illustrated, the light passed through the half mirror 10 (FIG. 1) is obliquely projected onto a parallel flat plate 401, and light beams as reflected by the top and the bottom of the parallel flat plate 401, respectively, are caused to interfere with each other. Since the lights from the top and bottom of the parallel plate are laterally shifted, like the second embodiment, the interference fringe to be observed corresponds to a differentiated value of the total wavefront aberrations of the projection lens 16 and the remaining optical systems. Thus, in a similar manner, by integrating the same and then by subtracting the system error wavefront aberration therefrom, the wavefront aberration of only the projection lens 16 can be determined.

In the structure of this embodiment, the light path up to the CCD camera 28 surface is used in common. Therefore, very stable measurement is attainable. Since the optical path difference between the reference light and the measurement light corresponds to about twice the thickness of the parallel plate 401, the structure is particularly effective in a case wherein the light source uses an excimer laser having a coherent length of about a few centimeters.

FIG. 5 is a schematic view of a main portion of an interferometer according to a fourth embodiment of the present invention.

In this embodiment, the interferometer 29 of FIG. 1 is structured into a Twyman-Green type interferometer 501. The light passed through a half mirror 21 is collected by a collimator lens 504 upon a spatial filter 505. After passing through the spatial filter 505, the light is reflected by a spherical surface mirror 506 having a curvature center placed at a pinhole of the spatial filter 505, such that it is collected again on the spatial filter 505 and passes therethrough. The pinhole diameter of the spatial filter 505 is set to be substantially equal to an Airy disc as determined by the numerical aperture of the collimator lens 504. As a result of this, the light again emitted from the collimator lens 504 comprises a plane wave substantially free of aberration. It is then reflected by the half mirror 21 as a reference wave. Here, to be exact, the wavefront emitted from the collimator lens 504 includes a transmitted wavefront aberration from the collimator lens 504.

On the other hand, the light reflected by the half mirror 21 is reflected by a plane mirror 502, and it passes through the half mirror 21 as a measurement wave. It interferes with the reference wave and, through an imaging lens 507, an interference fringe is produced on a camera 508 by which the fringe can be observed.

Here, like the first embodiment, the plane mirror 502 is moved by a PZT device 503 by an amount of about the wavelength, such that the fringe processing based on the fringe scan method is performed. As has been described with reference to the first embodiment, the fringe processing may be made in accordance with an electron moire method. On that occasion, the plane mirror 502 may be tilted beforehand to produce a carrier fringe.

Figure 6:
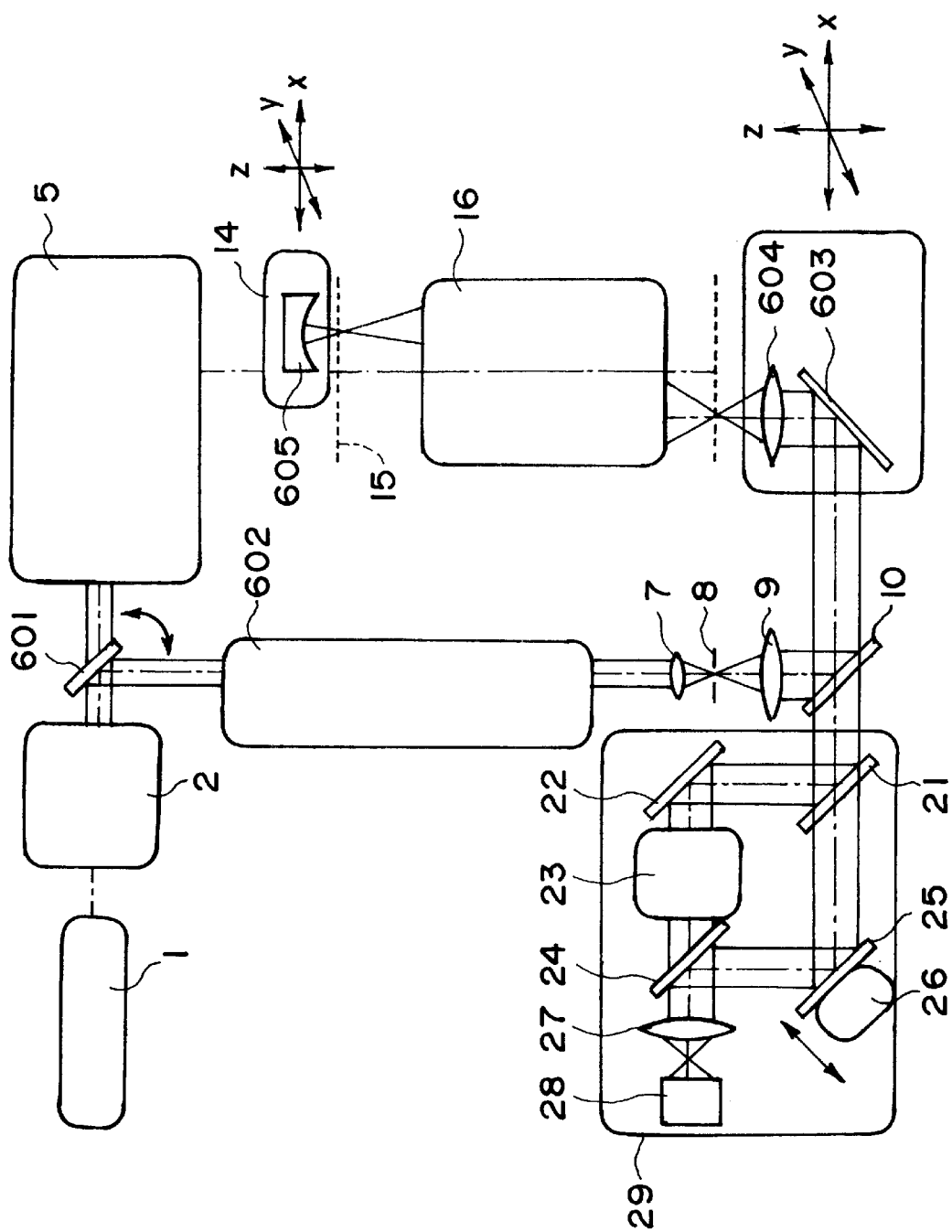
FIG. 6 is a schematic view of a main portion of a projection exposure apparatus according to a fifth embodiment of the present invention.

FIG. 6 is a schematic view of a projection exposure apparatus according to a fifth embodiment of the present invention.

In the embodiments described hereinbefore, the interferometer is provided on the reticle side (first object side). In this embodiment, an interferometer is disposed on the wafer stage side (second object side), while a spherical mirror 605 is placed on the reticle 14 side.

In this embodiment, for wavefront measurement, light from an exposure light source 1 is directed by a light path switching mirror 601 to a guiding optical system 602, via a beam shaping optical system, and then to an interferometer 29. The measurement light path is reversed as compared with the light path of FIG. 1, but basically it is the same as the latter. While the interferometer 29 comprises a radial share type interferometer as in the first embodiment, a lateral share type interferometer or a Twyman-Green type interferometer such as shown in FIGS. 3, 4 and 5 may be used in place of it.

When the interferometer 29 is disposed on the wafer stage side as in this embodiment, it can be placed away from the illumination optical system 5. Thus, it is less influenced by heat, such that more stable interference measurement is attainable. Further, since the numerical aperture (NA) of the collimator lens 604 becomes larger than that of the spherical mirror 605, it becomes possible to determine the whole shape of the spherical mirror 605 (i.e., system error) in the system error measurement based on the system error measuring method. If the interferometer is disposed on the reticle side, only the NA of a portion of the spherical mirror shape to be practically used can be determined.

Figure 7:
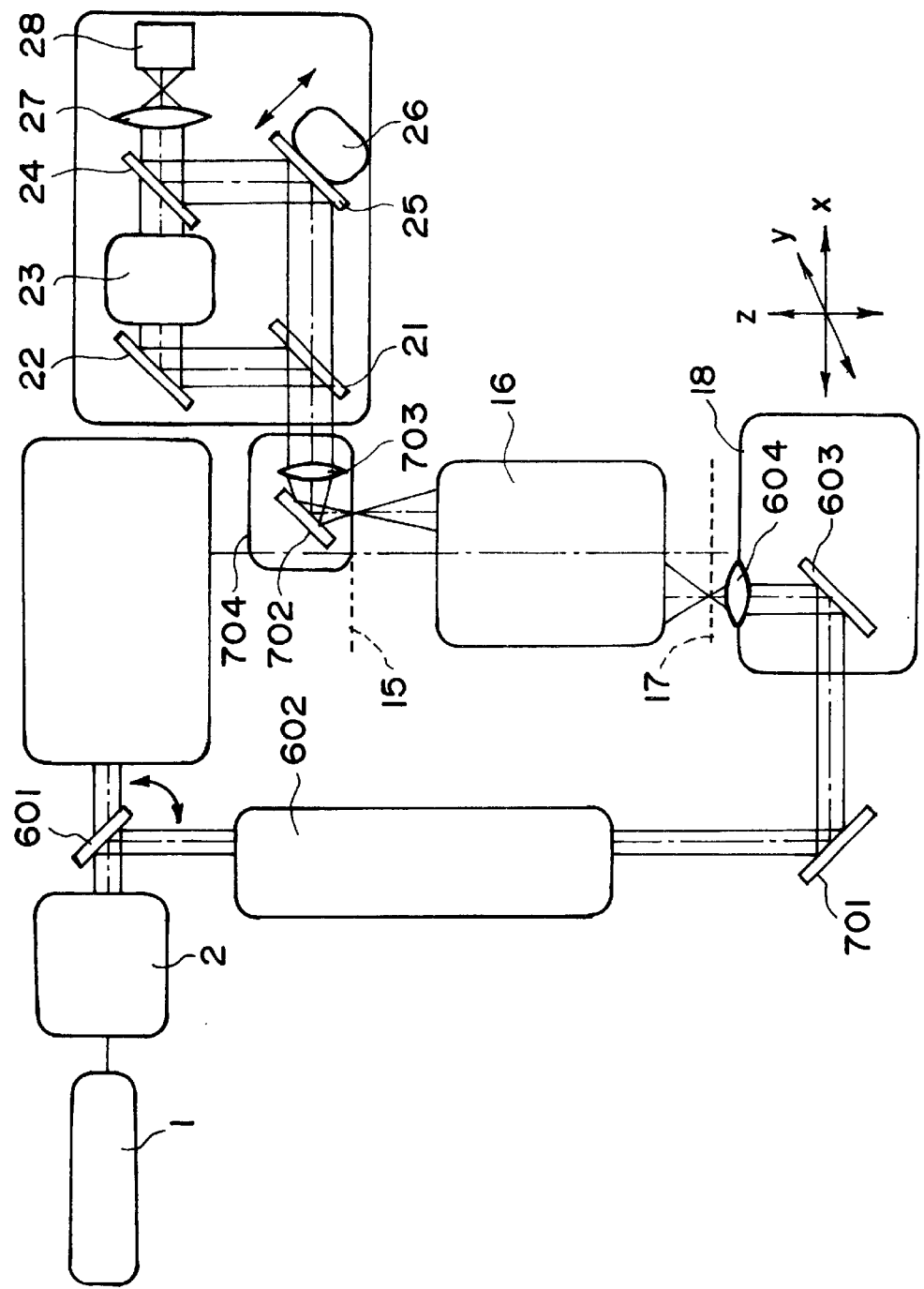
FIG. 7 is a schematic view of a main portion of a projection exposure apparatus according to a sixth embodiment of the present invention.

FIG. 7 is a schematic view of a main portion of a projection exposure apparatus according to a sixth embodiment of the present invention.

In this embodiment, light from a light source 1 is directed via a beam shaping optical system 2, a light path switching mirror 601, a light guiding optical system 602, and mirrors 701 and 603, and then it is directed by a condensing lens 604 toward the wafer stage side and is collected upon a wafer 17 surface. The light from the wafer 17 surface is imaged by a projection optical system 16 upon a reticle 15 surface. The light therefrom is received by an interferometer 29, disposed on the reticle side and being similar to that shown in FIG. 1, by which measurement of wavefront aberration is performed. In this embodiment, a single-path interferometer system is structured.

Figure 8:
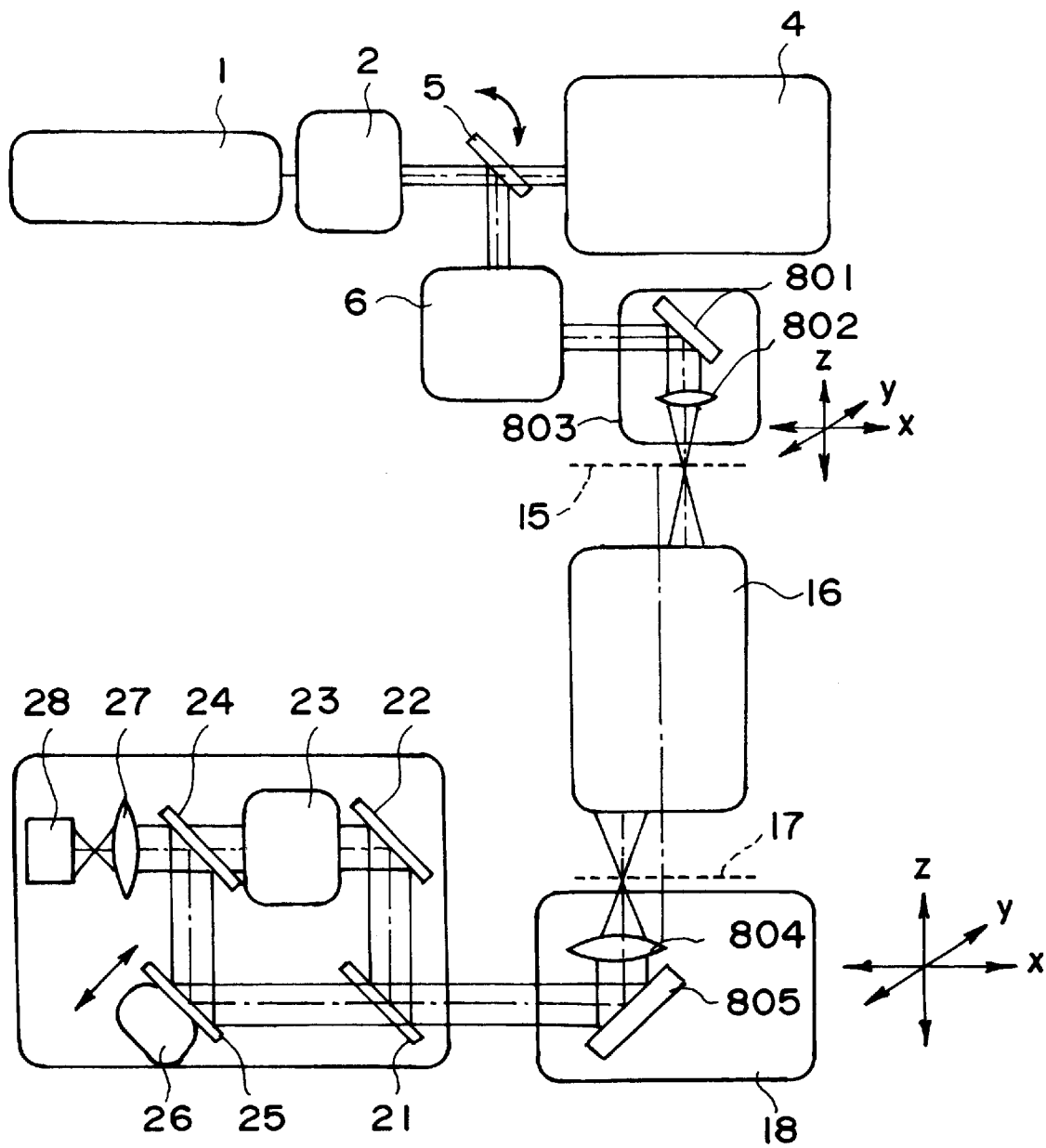
FIG. 8 is a schematic view of a main portion of a projection exposure apparatus according to a seventh embodiment of the present invention.

FIG. 8 is a schematic view of a main portion of a projection exposure apparatus according to a seventh embodiment of the present invention.

In this embodiment, light from a light source 1 is directed via a beam shaping optical system 2, a switching mirror 5, a light guiding optical system 6, a mirror 801 and a lens 802, toward a reticle 15 side, and the light is collected upon the reticle 15 surface. Then, the light is imaged by the projection optical system 16, and it is received by an interferometer 29 disposed on the wafer side and being similar to that of FIG. 1, by which measurement of wavefront aberration is made. In this embodiment, while a single-path interferometer system is provided like the fifth embodiment described above, disposition of the interferometer differs from the latter.

In the first, second, third, fourth and sixth embodiments, of the embodiments described hereinbefore, wherein an interferometer is disposed on the reticle side, an objective lens of a TTR alignment scope provided in the exposure apparatus may be used also as a collimator lens 12 or 703 for directing light from the reticle surface to the interferometer. On that occasion, a half mirror or a switching mirror may be disposed after transmission through the collimator lens, by which switching between wavefront measurement and alignment observation may be made.

Further, in all the embodiments described hereinbefore, field curvature and distortion of the projections lens 16 can be determined on the basis of a revolutionally asymmetrical component of the wavefront as obtained through the wavefront measurement, particularly, a tilt component, and a revolutionally symmetrical component thereof, particularly, a defocus component, as well as the X-Y-Z coordinates of the spherical mirror 20 and the collimator lens 12 upon wavefront measurement as obtainable from a distance measuring system, for example.

In accordance with wavefront aberration, field curvature and distortion of the projection lens 16 as measured by use of an interferometer such as described with reference to any one of the first to seventh embodiments, a spacing adjusting mechanism or an eccentricity adjusting mechanism which, may be provided inside the projection lens 16, may be operated to adjust and control the aberrations to a desired level.

Thus, in accordance with the embodiments of the present invention as described hereinbefore, a projection exposure apparatus having an interferometer can be accomplished, by which an optical performance of a projection optical system can be measured and inspected conveniently and precisely in a short time, upon a main assembly of the projection exposure apparatus and under various illumination conditions.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an exposure light source;
   an illumination system for illuminating a pattern, formed on a first object, with light from said exposure light source and passing through said illumination system;
   a projection optical system for projecting the pattern, as illuminated with the light, onto a second object; and
   an interferometer for use in measurement of an optical characteristic of said projection optical system, wherein said interferometer is operable to perform the measurement by use of light from said exposure light source.

2. An apparatus according to claim 1, wherein said interferometer is operable to measure at least one of wavefront aberration, field curvature and distortion of said projection optical system.

3. An apparatus according to claim 1, wherein said interferometer is disposed on one side of said projection optical system, facing the first object.

4. An apparatus according to claim 1, wherein said interferometer is disposed on one side of said projection optical system, facing the second object.

5. An apparatus according to claim 1, wherein said illuminations system includes incoherency transforming means for incoherency transforming the exposure light from said exposure light source and for directing the same to the first object, and wherein a light path switching means is disposed between said exposure light source and said incoherency transforming means, by which the light from said exposure light source can be selectively directed to one of said interferometer and said incoherency transforming means.

6. An apparatus according to claim 1, wherein said interferometer includes a collimator lens mountably and demountably inserted on a path of the exposure light, for transforming, into parallel light, light converged on and diverged from one of the surface of the first object and the surface of the second object.

7. An apparatus according to claim 1, wherein said interferometer has a function for making optical path lengths for reference light and detection light registered with each other.

8. An apparatus according to claim 1, further comprising an alignment scope having an objective lens, for alignment between the first and second objects, wherein said interferometer includes a collimator lens for transforming, into parallel light, light converged on and diverged from one of the surface of the first object and the surface of the second object, and wherein said objective lens of said alignment scope functions also as said collimator lens.

9. An apparatus according to claim 1, further comprising reflection means disposed on one side of said projection optical system facing to one of the first and second objects, wherein the light passing through said projection optical system is reflected by said reflection means backwardly along its oncoming path, so that it is directed to said interferometer.

10. An apparatus according to claim 9, wherein said reflection means comprises one of a spherical surface mirror, a plane mirror and a wafer.

11. An apparatus according to claim 9, wherein said reflection means is provided on a movable stage for carrying thereon the second object.

12. An apparatus according to claim 9, wherein a field curvature of said projection optical system is detected on the basis of a revolutionally symmetrical component involved in a wavefront as measured by said interferometer and of coordinate positions, with respect to an optical axis direction, of said reflection means and said collimator lens of said interferometer upon measurement of the wavefront.

13. An apparatus according to claim 12, wherein the revolutionally symmetrical component is a power component.

14. An apparatus according to claim 9, wherein distortion of said projection optical system is detected on the basis of a revolutionally asymmetrical component involved in a wavefront as measured by said interferometer and of coordinate positions, with respect to an optical axis direction, of said reflection means and said collimator lens of said interferometer upon measurement of the wavefront.

15. An apparatus according to claim 12, wherein the revolutionally asymmetrical component is a tilt component.

* * * * *

UNITED STATES PATENT AND TRADEMARK OFFICE
CERTIFICATE OF CORRECTION

PATENT NO. : 6,614,535 B1
DATED : September 2, 2003
INVENTOR(S) : Osamu Kakuchi et al.

It is certified that error appears in the above-identified patent and that said Letters Patent is hereby corrected as shown below:

Column 8,
Line 4, "suring" should read -- surement --.
Line 49, "illuminations" should read -- illumination --.

Signed and Sealed this

Ninth Day of March, 2004

JON W. DUDAS
*Acting Director of the United States Patent and Trademark Office*